(12) United States Patent
Masunishi et al.

(10) Patent No.: US 11,531,042 B2
(45) Date of Patent: Dec. 20, 2022

(54) SENSOR AND ELECTRONIC DEVICE

(71) Applicant: KABUSHIKI KAISHA TOSHIBA, Tokyo (JP)

(72) Inventors: Kei Masunishi, Kawasaki Kanagawa (JP); Yasushi Tomizawa, Tokyo (JP); Etsuji Ogawa, Kawasaki Kanagawa (JP); Ryunosuke Gando, Yokohama Kanagawa (JP); Shiori Kaji, Kawasaki Kanagawa (JP); Hiroki Hiraga, Saitama Saitama (JP); Fumito Miyazaki, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/249,462

(22) Filed: Mar. 2, 2021

(65) Prior Publication Data

US 2021/0396780 A1  Dec. 23, 2021

(30) Foreign Application Priority Data

Jun. 19, 2020 (JP) .............................. JP2020-106260

(51) Int. Cl.
*G01P 15/097* (2006.01)
*B81B 3/00* (2006.01)
*G01P 15/125* (2006.01)

(52) U.S. Cl.
CPC .......... *G01P 15/097* (2013.01); *B81B 3/0021* (2013.01); *B81B 3/0045* (2013.01);
(Continued)

(58) Field of Classification Search
CPC .... G01P 15/097; G01P 15/125; B61B 3/0045; B61B 3/0021
See application file for complete search history.

(56) References Cited

U.S. PATENT DOCUMENTS

2001/0039467 A1* 11/2001 Katz ...................... G01C 21/16
701/4
2003/0155221 A1* 8/2003 Kawai ...................... H01G 5/16
200/43.01
(Continued)

FOREIGN PATENT DOCUMENTS

DE  102019205349 A1 * 10/2020
JP  H4-115165 A  4/1992

OTHER PUBLICATIONS

Dongsuk D. Shin et al., "Environmentally Robust Differential Resonant Accelerometer in a Wafer-Scale Encapsulation Process," IEEE MEMS 2017, pp. 17-20 (2017).

*Primary Examiner* — Helen C Kwok
(74) *Attorney, Agent, or Firm* — Finnegan, Henderson, Farabow, Garrett & Dunner, LLP

(57) ABSTRACT

According to one embodiment, a sensor includes a base body, a first supporter fixed to the base body, and a first movable part separated from the base body. The first movable part includes a first movable base part supported by the first supporter, a second movable base part connected with the first movable base part, and a first movable beam. The first movable beam includes a first beam, a first movable conductive part, and a first connection region. The first beam includes a first beam portion, a second beam portion, and a third beam portion between the first beam portion and the second beam portion. The first beam portion is connected with the first movable base part. The second beam portion is connected with the second movable base part. The first connection region connects the third beam portion and the first movable conductive part.

19 Claims, 12 Drawing Sheets

(52) U.S. Cl.
CPC .... *G01P 15/125* (2013.01); *B81B 2201/0235* (2013.01); *B81B 2203/0118* (2013.01)

(56) References Cited

U.S. PATENT DOCUMENTS

| | | | |
|---|---|---|---|
| 2011/0313703 A1* | 12/2011 | Petillon | G01C 19/56 73/504.18 |
| 2012/0038963 A1* | 2/2012 | Takubo | G01C 19/5747 359/224.1 |
| 2015/0068314 A1* | 3/2015 | Nakamura | G01L 9/0072 73/723 |
| 2017/0268878 A1* | 9/2017 | Yamamoto | G01C 19/5733 |
| 2021/0221677 A1* | 7/2021 | Shao | B81C 1/00182 |

* cited by examiner

SENSOR AND ELECTRONIC DEVICE

CROSS-REFERENCE TO RELATED APPLICATIONS

This application is based upon and claims the benefit of priority from Japanese Patent Application No. 2020-106260, filed on Jun. 19, 2020; the entire contents of which are incorporated herein by reference.

FIELD

Embodiments described herein relate generally to a sensor and an electronic device.

BACKGROUND

For example, there is a sensor that utilizes a MEMS structure. It is desirable to increase the detection accuracy of the sensor.

DETAILED DESCRIPTION

Figure 1A:
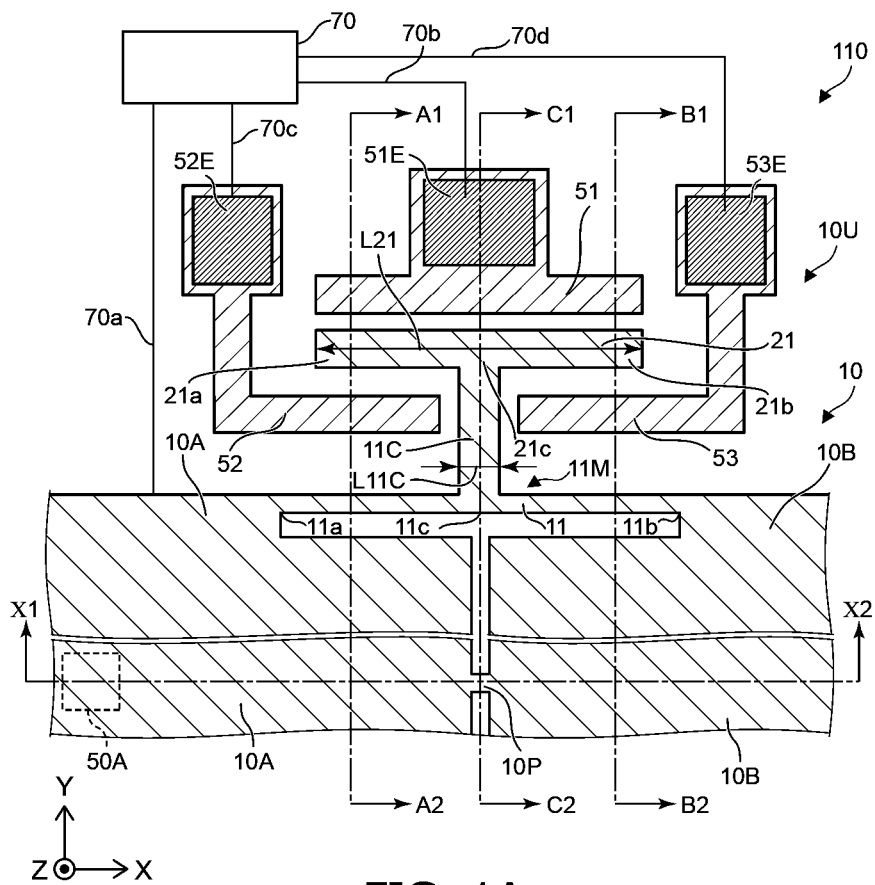
FIGS. 1A and 1B are schematic views illustrating a sensor according to a first embodiment.

According to one embodiment, a sensor includes a base body, a first supporter fixed to the base body, and a first movable part separated from the base body. The first movable part includes a first movable base part supported by the first supporter, a second movable base part connected with the first movable base part, and a first movable beam. The first movable beam includes a first beam, a first movable conductive part, and a first connection region. The first beam includes a first beam portion, a second beam portion, and a third beam portion between the first beam portion and the second beam portion. The first beam portion is connected with the first movable base part. The second beam portion is connected with the second movable base part. The first connection region connects the third beam portion and the first movable conductive part. A length of the first movable conductive part along a first direction is greater than a length of the first connection region along the first direction. The first direction is from the first beam portion toward the second beam portion.

According to one embodiment, an electronic device includes the sensor described above, and a circuit controller configured to control a circuit based on a signal obtained from the sensor.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1A to 2C are schematic views illustrating a sensor according to a first embodiment.

Figure 1B:
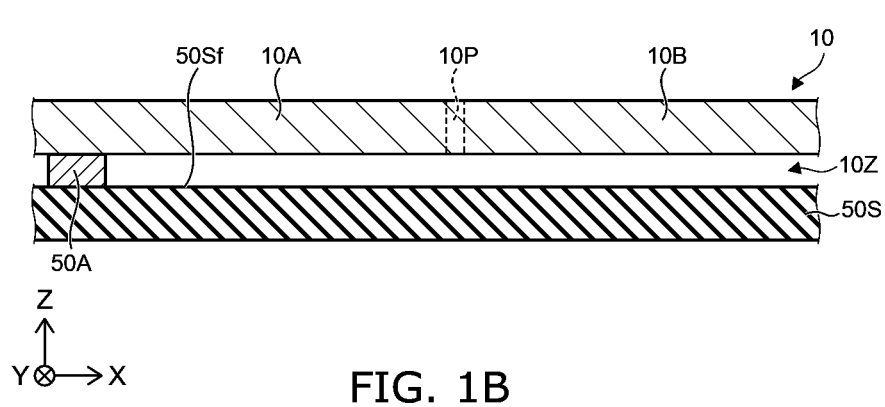
Figure 2A:
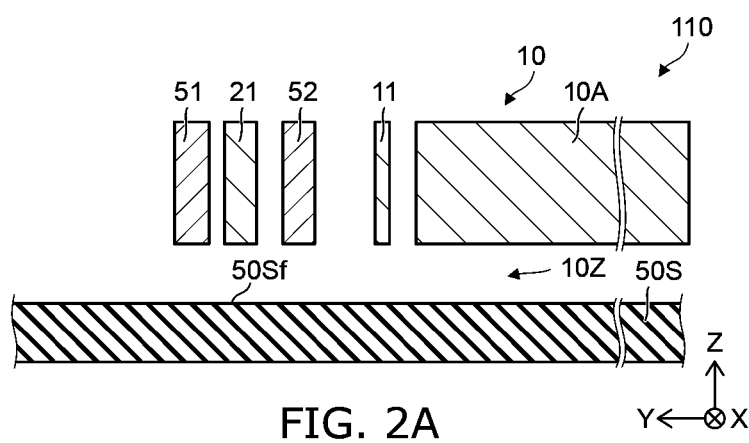
FIGS. 2A to 2C are schematic views illustrating the sensor according to the first embodiment.
Figure 2B:
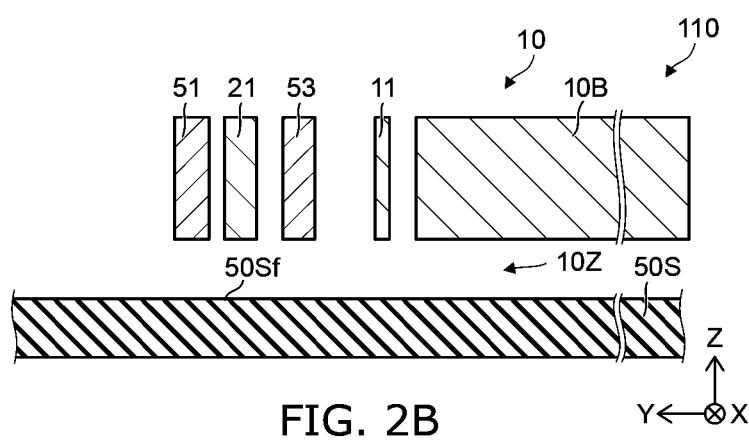
Figure 2C:
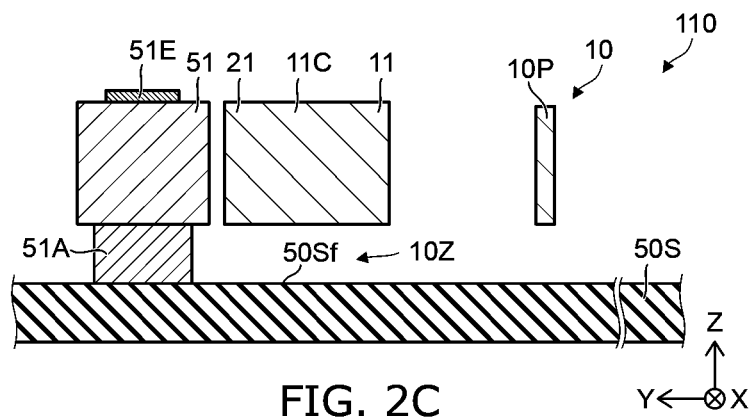

FIG. 1A is a plan view. FIG. 1B is a line X1-X2 cross-sectional view of FIG. 1A. FIG. 2A is a line A1-A2 cross-sectional view of FIG. 1A. FIG. 2B is a line B1-B2 cross-sectional view of FIG. 1A. FIG. 2C is a line C1-C2 cross-sectional view of FIG. 1A.

As shown in FIGS. 1A and 1B, the sensor 110 according to the embodiment includes a base body 50S, a first supporter 50A, and a first movable part 10. The first supporter 50A and the first movable part 10 are included in an element part 10U.

The first supporter 50A is fixed to the base body 50S. The first movable part 10 is supported by the first supporter 50A. The first movable part 10 is separated from the base body 50S.

A gap 10Z is provided between the base body 50S and the first movable part 10. For example, the base body 50S includes a first surface 50Sf. The gap 10Z is between the first surface 50Sf and the first movable part 10.

A direction perpendicular to the first surface 50Sf is taken as a Z-axis direction. One direction perpendicular to the Z-axis direction is taken as an X-axis direction. A direction perpendicular to the Z-axis direction and the X-axis direction is taken as a Y-axis direction.

As shown in FIG. 1A, the first movable part 10 includes a first movable base part 10A, a second movable base part 10B, and a first movable beam 11M. The first movable base part 10A is supported by the first supporter 50A. The second movable base part 10B is connected with the first movable base part 10A. The first movable part 10 is supported by the first supporter 50A by the first movable base part 10A being supported by the first supporter 50A.

In the example, the first movable part 10 further includes a connection part 10P. The connection part 10P is located between the first movable base part 10A and the second movable base part 10B. The connection part 10P connects the second movable base part 10B with the first movable base part 10A. The connection part 10P is, for example, a pivot part or a hinge part. For example, the length along the Y-axis direction of the connection part 10P is less than the length along the Y-axis direction of the first movable base part 10A and less than the length along the Y-axis direction of the second movable base part 10B. For example, the length along the X-axis direction of the connection part 10P is less than the length along the X-axis direction of the first movable base part 10A and less than the length along the X-axis direction of the second movable base part 10B.

As shown in FIG. 1A, the first movable beam 11M includes a first beam 11, a first movable conductive part 21, and a first connection region 11C. The first beam 11 includes a first beam portion 11a, a second beam portion 11b, and a third beam portion 11c. The third beam portion 11c is between the first beam portion 11a and the second beam portion 11b. The first beam portion 11a is connected with the first movable base part 10A. The second beam portion 11b is connected with the second movable base part 10B.

In the example, a first direction from the first beam portion 11a toward the second beam portion 11b is along the X-axis direction. The first beam 11 extends along the X-axis direction. The third beam portion 11c is, for example, the X-axis direction central portion of the first beam 11.

The first connection region 11C connects the third beam portion 11c and the first movable conductive part 21. For example, the distance along the X-axis direction between the first connection region 11C and the first movable base part 10A may be substantially equal to the distance along the X-axis direction between the first connection region 11C and the second movable base part 10B.

The first movable conductive part 21 includes a portion 21a, a portion 21b, and a portion 21c. The portion 21c is between the portion 21a and the portion 21b. The direction from the portion 21a toward the portion 21b is, for example, along the first direction (the X-axis direction). The portion 21c is, for example, the X-axis direction central portion of the first movable conductive part 21. The first connection region 11C connects the third beam portion 11c and the portion 21c. For example, the first connection region 11C extends along the Y-axis direction.

The length of the first movable conductive part 21 along the first direction (the X-axis direction) is taken as a length L21. The length of the first connection region 11C along the first direction (the X-axis direction) is taken as a length L11C. According to the embodiment, the length L21 is greater than the length L11C. Due to such a configuration, the surface area at which the first movable conductive part 21 and the counter conductive part facing the first movable conductive part 21 overlap can be large. For example, the electrical capacitance between the first movable conductive part 21 and the counter conductive part facing the first movable conductive part 21 can be large. The change of the electrical capacitance generated when the first beam 11 of the first movable beam 11M is displaced can be large. Or, because the surface area at which the first movable conductive part 21 and the counter conductive part facing the first movable conductive part 21 overlap can be large, the first movable beam 11M can be efficiently vibrated by applying an alternating current voltage to the counter conductive part. According to the embodiment, a sensor can be provided in which the detection accuracy can be increased.

As shown in FIG. 1A, for example, the sensor 110 further includes a first counter conductive part 51. As shown in FIG. 2C, for example, the first counter conductive part 51 is fixed to the base body 50S via an insulating member 51A. The first counter conductive part 51 faces the first movable conductive part 21. For example, an electrode 51E that is electrically connected with the first counter conductive part 51 may be provided.

As shown in FIG. 1A, the sensor 110 may further include a controller 70. For example, the controller 70 is electrically connected with the first movable beam 11M by wiring 70a.

For example, the controller 70 is electrically connected with the first counter conductive part 51 by wiring 70b and the electrode 51E. For example, the controller 70 may detect the electrical capacitance between the first movable conductive part 21 and the first counter conductive part 51. As described above, the surface area at which the first movable conductive part 21 and the first counter conductive part 51 overlap can be large. For example, the change of the electrical capacitance generated when the first beam 11 is displaced is increased thereby, and the displacement of the first beam 11 can be efficiently detected. For example, the controller 70 may vibrate the first movable beam 11M by applying an alternating current voltage between the first movable conductive part 21 and the first counter conductive part 51. In such a case, the first movable beam 11M can be efficiently vibrated.

As shown in FIG. 1A, the sensor 110 may further include a second counter conductive part 52. The second counter conductive part 52 is fixed to the base body 50S. The second counter conductive part 52 faces the first movable conductive part 21. In the example, the second counter conductive part 52 faces the portion 21a of the first movable conductive part 21. In the example, at least a portion (the portion 21a) of the first movable conductive part 21 is between the second counter conductive part 52 and the first counter conductive part 51 in a direction (in the example, the Y-axis direction) crossing the first direction (the X-axis direction). For example, an electrode 52E that is electrically connected with the second counter conductive part 52 may be provided.

As shown in FIG. 1A, for example, the controller 70 is electrically connected with the second counter conductive part 52 by wiring 70c and the electrode 52E. For example, the controller 70 may vibrate the first movable beam 11M by applying an alternating current voltage between the first movable conductive part 21 and the second counter conductive part 52. In such a case, the first movable beam 11M can be efficiently vibrated.

As shown in FIG. 1A, the sensor 110 may further include a third counter conductive part 53. The third counter conductive part 53 is fixed to the base body 50S. The third counter conductive part 53 faces the first movable conductive part 21. For example, a portion (the portion 21b) of the first movable conductive part 21 is between the third counter conductive part 53 and the first counter conductive part 51 in a direction (in the example, the Y-axis direction) crossing the first direction (the X-axis direction). In the example, at least a portion of the first connection region 11C is between the second counter conductive part 52 and the third counter conductive part 53 in the first direction (the X-axis direction). For example, an electrode 53E that is electrically connected with the third counter conductive part 53 may be provided.

As shown in FIG. 1A, for example, the controller 70 is electrically connected with the third counter conductive part 53 by wiring 70d and the electrode 53E. For example, the controller 70 may vibrate the first movable beam 11M by applying an alternating current voltage between the first movable conductive part 21 and the third counter conductive part 53. In such a case, the first movable beam 11M can be efficiently vibrated.

Figure 3:
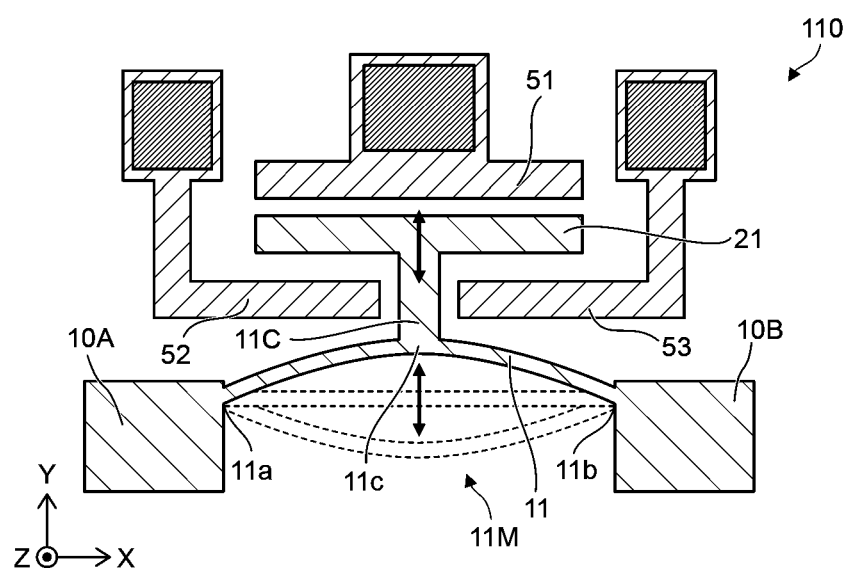
FIG. 3 is a schematic plan view illustrating the sensor according to the first embodiment.

FIG. 3 is a schematic plan view illustrating the sensor according to the first embodiment.

For example, the first movable beam 11M is vibrated as shown in FIG. 3 by applying an alternating current voltage between the first movable conductive part 21 and the second counter conductive part 52 and between the first movable conductive part 21 and the third counter conductive part 53.

For example, the first beam 11 of the first movable beam 11M vibrates along the Y-axis direction. For example, resonance is generated in the first beam 11 by appropriately controlling the frequency of the alternating current voltage. The first beam 11 is, for example, a resonant beam.

The central portion (the third beam portion 11c) of the first beam 11 at which the vibration is large is connected with the first movable conductive part 21 by the first connection region 11C. For example, the maximum amplitude of the resonant beam can be utilized. For example, the first movable conductive part 21 is displaceable with the maximum amplitude of the resonant beam. For example, an efficient vibration is obtained. For example, the alternating current voltage for generating the vibration can be low. For example, low-voltage driving is obtained.

For example, a signal that is generated between the first movable conductive part 21 and the first counter conductive part 51 (e.g., a signal that corresponds to the change of the electrical capacitance) is efficiently obtained. For example, high capacitance sensitivity is obtained. For example, high-accuracy detection is possible. According to the embodiment, the detection and the driving of the resonant beam may be interchanged with each other in the description recited above.

By providing a first movable conductive part 21 such as that described above, the resonant frequency of the first movable beam 11M (the first beam 11) can be low. For example, by utilizing the mass of the first movable conductive part 21, it is easier to reduce the resonant frequency without making the first movable beam 11M (the first beam 11) long.

The sensor 110 is, for example, a resonant accelerometer. As described below, the base body 50S, the element part 10U, etc., that are included in the sensor 110 are provided in a depressurized container, etc. For example, the resonant frequency of the first movable beam 11M (the first beam 11) changes due to the acceleration applied to the sensor 110. For example, the change of the resonant frequency is caused by the strain of the first beam 11 generated by the acceleration. By detecting the change of the resonant frequency, the acceleration that is applied to the sensor 110 can be detected with high sensitivity and high accuracy.

Thus, in the sensor 110, the controller 70 may apply an alternating current voltage between the first movable conductive part and the second counter conductive part 52 (and/or the third counter conductive part 53). The controller 70 may be configured to detect the change of the resonant frequency of the first movable beam 11M (e.g., the first beam 11) by detecting a signal between the first counter conductive part 51 and the first movable conductive part 21. For example, efficient resonant driving is obtained. For example, the change of the resonant frequency can be detected with high accuracy.

According to the embodiment, for example, a high mechanical Q-factor is obtained. For example, high capacitance sensitivity is obtained. A high S/N ratio is obtained. According to the embodiment, a sensor can be provided in which the detection accuracy can be increased.

Figure 4:
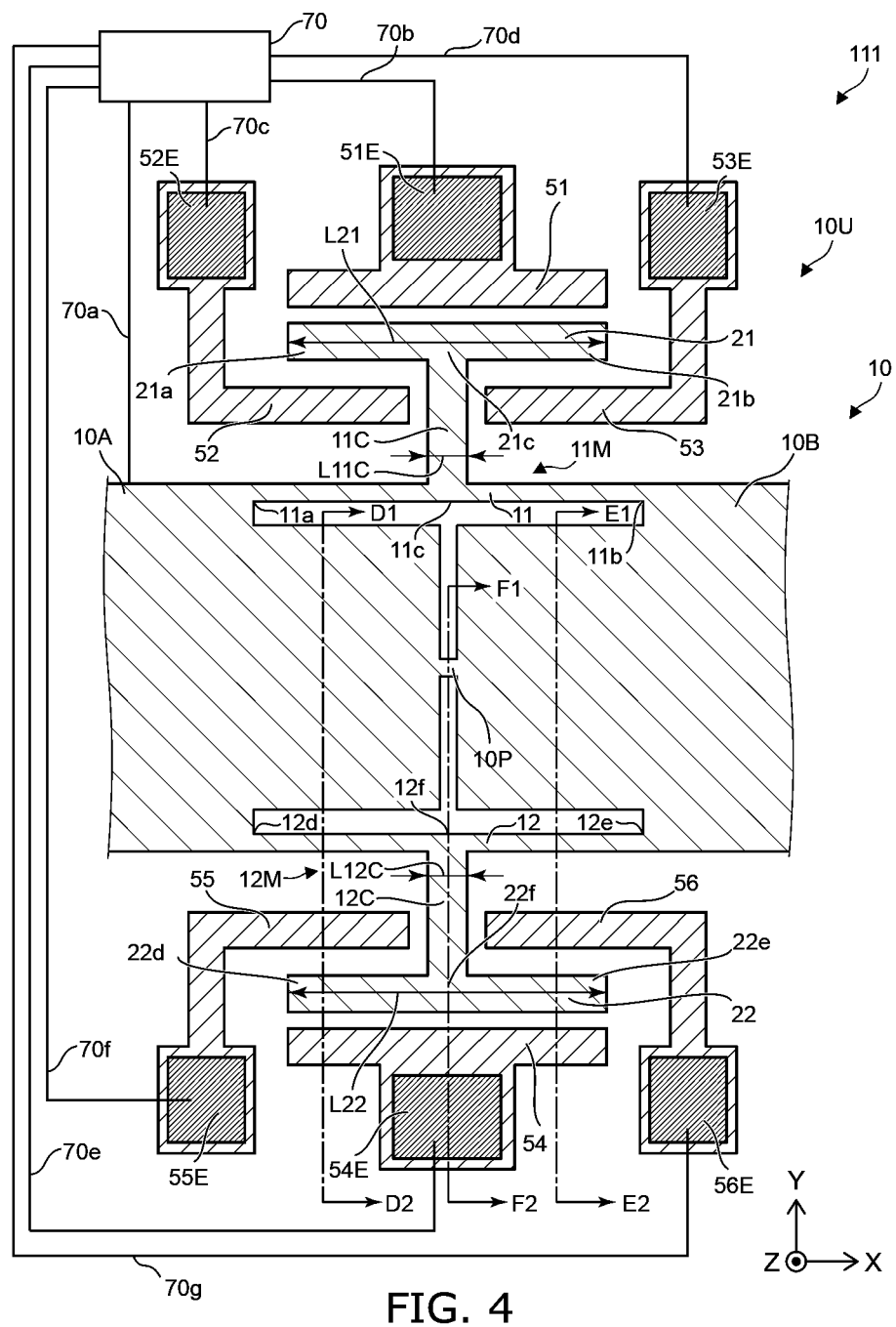
FIG. 4 is a schematic view illustrating a sensor according to the first embodiment.
Figure 5A:
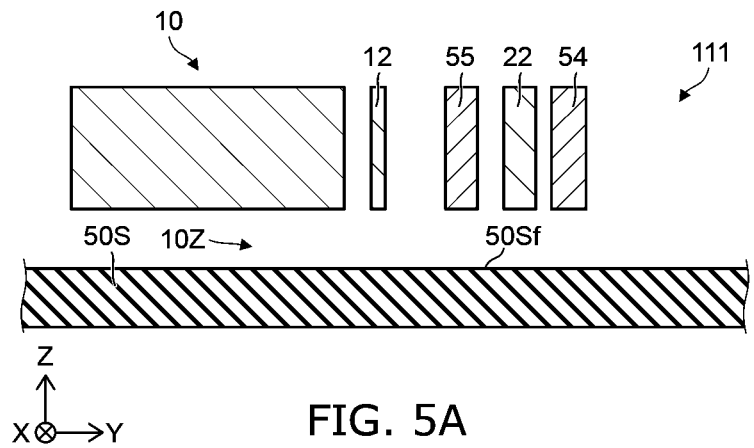
FIGS. 5A to 5C are schematic views illustrating a sensor according to the first embodiment.
Figure 5B:
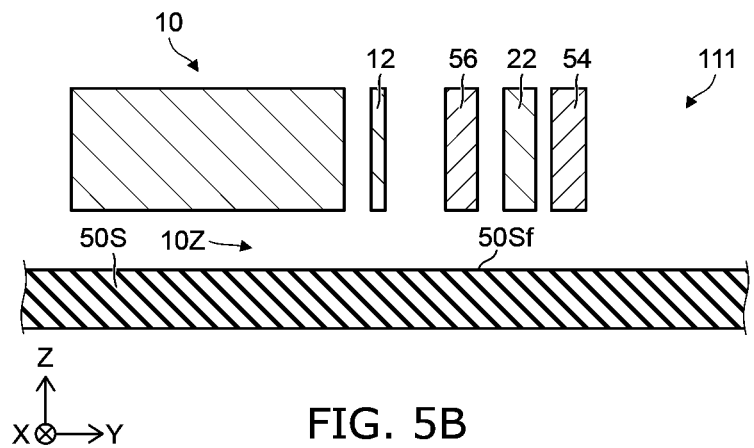
Figure 5C:
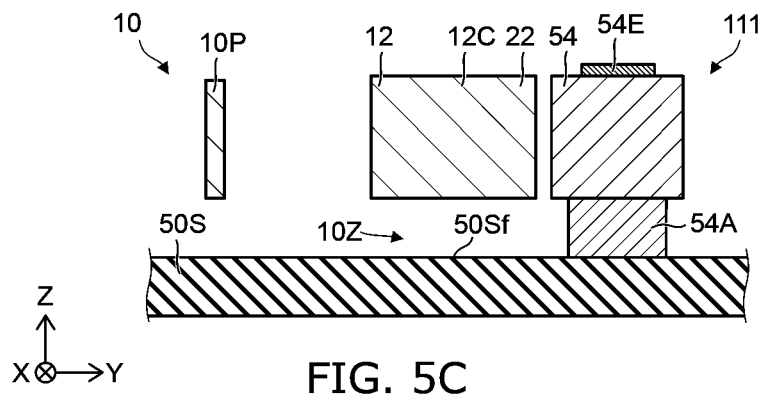

FIGS. 4 to 5C are schematic views illustrating a sensor according to the first embodiment.

FIG. 4 is a plan view. FIG. 5A is a line D1-D2 cross-sectional view of FIG. 4. FIG. 5B is a line E1-E2 cross-sectional view of FIG. 4. FIG. 5C is a line F1-F2 cross-sectional view of FIG. 4.

As shown in FIGS. 4 to 5C, the sensor 111 according to the embodiment also includes the first movable part 10. The sensor 111 includes the base body 50S and the first supporter 50A (referring to FIGS. 1A and 1B). The base body 50S and the first supporter 50A are not illustrated in FIG. 4. The first movable part 10 further includes a second movable beam 12M in addition to the first movable beam 11M. The first movable beam 11M of the sensor 111 may be similar to the first movable beam 11M of the sensor 110. An example of the second movable beam 12M will now be described.

As shown in FIG. 4, the position of the connection part 10P in a second direction (in the example, the Y-axis direction) crossing the first direction (the X-axis direction) is between the position of the second movable beam 12M in the second direction (the Y-axis direction) and the position of the first movable beam 11M in the second direction (the Y-axis direction). For example, the connection part 10P is between the second movable beam 12M and the first movable beam 11M in the X-Y plane.

The second movable beam 12M includes a second beam 12, a second movable conductive part 22, and a second connection region 12C. The second beam 12 includes a fourth beam portion 12d, a fifth beam portion 12e, and a sixth beam portion 12f. The sixth beam portion 12f is between the fourth beam portion 12d and the fifth beam portion 12e. The fourth beam portion 12d is connected with the first movable base part 10A. The fifth beam portion 12e is connected with the second movable base part 10B. The direction from the fourth beam portion 12d toward the fifth beam portion 12e is along the first direction (the X-axis direction).

The second connection region 12C connects the sixth beam portion 12f and the second movable conductive part 22. For example, the distance along the X-axis direction between the second connection region 12C and the first movable base part 10A may be substantially equal to the distance along the X-axis direction between the second connection region 12C and the second movable base part 10B.

The second movable conductive part 22 includes a portion 22d, a portion 22e, and a portion 22f. The portion 22f is between the portion 22d and the portion 22e. For example, the direction from the portion 22d toward the portion 22e is along the first direction (the X-axis direction). The portion 22d is, for example, the X-axis direction central portion of the second movable conductive part 22. The second connection region 12C connects the sixth beam portion 12f and the portion 22f. For example, the second connection region 12C extends along the Y-axis direction.

A length L22 of the second movable conductive part 22 along the first direction (the X-axis direction) is greater than a length L12C of the second connection region 12C along the first direction. Due to such a configuration, the surface area at which the second movable conductive part 22 and the counter conductive part facing the second movable conductive part 22 overlap can be large. For example, the electrical capacitance between the second movable conductive part 22 and the counter conductive part facing the second movable conductive part 22 can be large. The change of the electrical capacitance generated when the second beam 12 of the second movable beam 12M is displaced can be large. For example, the second movable conductive part 22 may be displaced at the maximum displacement of the second beam 12 when the second beam 12 of the second movable beam 12M is displaced. The change of the generated electrical capacitance can be increased thereby. Or, because the surface area at which the second movable conductive part 22 and the counter conductive part facing the second movable conductive part 22 overlap can be large, the second movable beam 12M can be efficiently vibrated by applying an alternating current voltage to the counter conductive part. According to the embodiment, a sensor can be provided in which the detection accuracy can be increased.

By providing a second movable conductive part 22 such as that described above, the resonant frequency of the second movable beam 12M (the second beam 12) can be low. For example, by utilizing the mass of the second movable conductive part 22, it is easier to reduce the resonant frequency without making the second movable beam 12M (the second beam 12) long. For example, the second movable conductive part 22 is electrically connected with the first movable conductive part 21.

In the example as shown in FIG. 4, the connection part 10P is between the second movable conductive part 22 and the first movable conductive part 21 in the second direction (the Y-axis direction). The second beam 12 is between the second movable conductive part 22 and the connection part 10P in the second direction (the Y-axis direction). The first beam 11 is between the connection part 10P and the first movable conductive part 21 in the second direction (the Y-axis direction).

For example, the first movable beam 11M and the second movable beam 12M are symmetric with respect to a line segment that is along the first direction and passes through the connection part 10P.

As shown in FIG. 4, the sensor 111 may include a fourth counter conductive part 54. As shown in FIG. 5C, for example, the fourth counter conductive part 54 is fixed to the base body 50S via an insulating member 54A. The fourth counter conductive part 54 faces the second movable conductive part 22. For example, an electrode 54E that is electrically connected with the fourth counter conductive part 54 may be provided.

As shown in FIG. 4, for example, the controller 70 is electrically connected with the fourth counter conductive part 54 by wiring 70e and the electrode 54E. For example, the controller 70 may detect the electrical capacitance between the second movable conductive part 22 and the fourth counter conductive part 54. As described above, the surface area at which the second movable conductive part 22 and the fourth counter conductive part 54 overlap can be large. For example, the change of the electrical capacitance generated when the second beam 12 is displaced is increased thereby, and the displacement of the second beam 12 can be efficiently detected. For example, the controller 70 may vibrate the second movable beam 12M by applying an alternating current voltage between the second movable conductive part 22 and the fourth counter conductive part 54. In such a case, the second movable beam 12M can be efficiently vibrated.

As shown in FIG. 4, the sensor 111 may further include a fifth counter conductive part 55. The fifth counter conductive part 55 is fixed to the base body 50S. The fifth counter conductive part 55 faces the second movable conductive part 22. For example, at least a portion (the portion 22d) of the second movable conductive part 22 is between the fourth counter conductive part 54 and the fifth counter conductive part 55 in the second direction (the Y-axis direction). For example, an electrode 55E that is electrically connected with the fifth counter conductive part 55 may be provided.

As shown in FIG. 4, the sensor 111 may further include a sixth counter conductive part 56. The sixth counter conductive part 56 is fixed to the base body 50S. The sixth counter conductive part 56 faces the second movable conductive part 22. A portion (the portion 22e) of the second movable conductive part 22 is between the sixth counter conductive part 56 and the fourth counter conductive part 54 in the second direction (the Y-axis direction). In the example, at least a portion of the second connection region 12C is between the fifth counter conductive part 55 and the sixth counter conductive part 56 in the first direction (the X-axis direction). For example, an electrode 56E that is electrically connected with the sixth counter conductive part 56 may be provided.

As shown in FIG. 4, for example, the controller 70 is electrically connected with the fifth counter conductive part 55 by wiring 70f and the electrode 55E. For example, the controller 70 may vibrate the second movable beam 12M by applying an alternating current voltage between the second movable conductive part 22 and the fifth counter conductive part 55. In such a case, the second movable beam 12M can be efficiently vibrated.

As shown in FIG. 4, for example, the controller 70 is electrically connected with the sixth counter conductive part 56 by wiring 70g and the electrode 56E. For example, the controller 70 may vibrate the second movable beam 12M by applying an alternating current voltage between the second movable conductive part 22 and the sixth counter conductive part 56. In such a case, the second movable beam 12M can be efficiently vibrated.

For example, the controller 70 applies an alternating current voltage between the first movable conductive part 21 and the second counter conductive part 52 (and/or the third counter conductive part 53) and between the second movable conductive part 22 and the fifth counter conductive part 55 (and/or the sixth counter conductive part 56). The controller 70 is configured to detect a value relating to the difference between the resonant frequency of the first movable beam 11M (e.g., the first beam 11) and the resonant frequency of the second movable beam 12M (the second beam 12) by detecting a signal between the first counter conductive part 51 and the first movable conductive part 21 and a signal between the fourth counter conductive part 54 and the second movable conductive part 22. According to the embodiment, the detection and the driving of the resonant beam may be interchanged with each other in the description recited above.

For example, the resonant frequencies of the first movable beam 11M (the first beam 11) and the second movable beam 12M (the second beam 12) change due to the acceleration applied to the sensor 111. For example, the resonant frequencies change due to the strains of the first and second beams 11 and 12 generated by the acceleration. For example, compressive strain is generated in the second beam 12 when tensile strain is generated in the first beam 11. For example, tensile strain is generated in the second beam 12 when compressive strain is generated in the first beam 11. The resonant frequencies change due to these strains. The direction of the increase and decrease of the resonant frequency of the first beam 11 is the reverse of the direction of the increase and decrease of the resonant frequency of the second beam 12. By detecting a value corresponding to the difference between the resonant frequency of the first beam 11 and the resonant frequency of the second beam 12, the acceleration that is applied to the sensor 111 can be detected with high sensitivity and high accuracy.

Thus, in the sensor 111, the controller 70 can detect the acceleration with higher accuracy by detecting the difference between characteristics corresponding to the resonant frequency relating to the first movable beam 11M and characteristics corresponding to the resonant frequency relating to the second movable beam 12M. The sensor 111 is, for example, a differential resonant accelerometer (DRA). For example, the base body 50S, the element part 10U, etc., that are included in the sensor 111 may be provided in a depressurized container, etc.

According to the embodiment, for example, a high mechanical Q-factor is obtained. For example, high capacitance sensitivity is obtained. A high S/N ratio is obtained. According to the embodiment, a sensor can be provided in which the detection accuracy can be increased.

FIGS. 6A to 8 are schematic plan views illustrating a sensor according to the first embodiment.

Figure 6A:
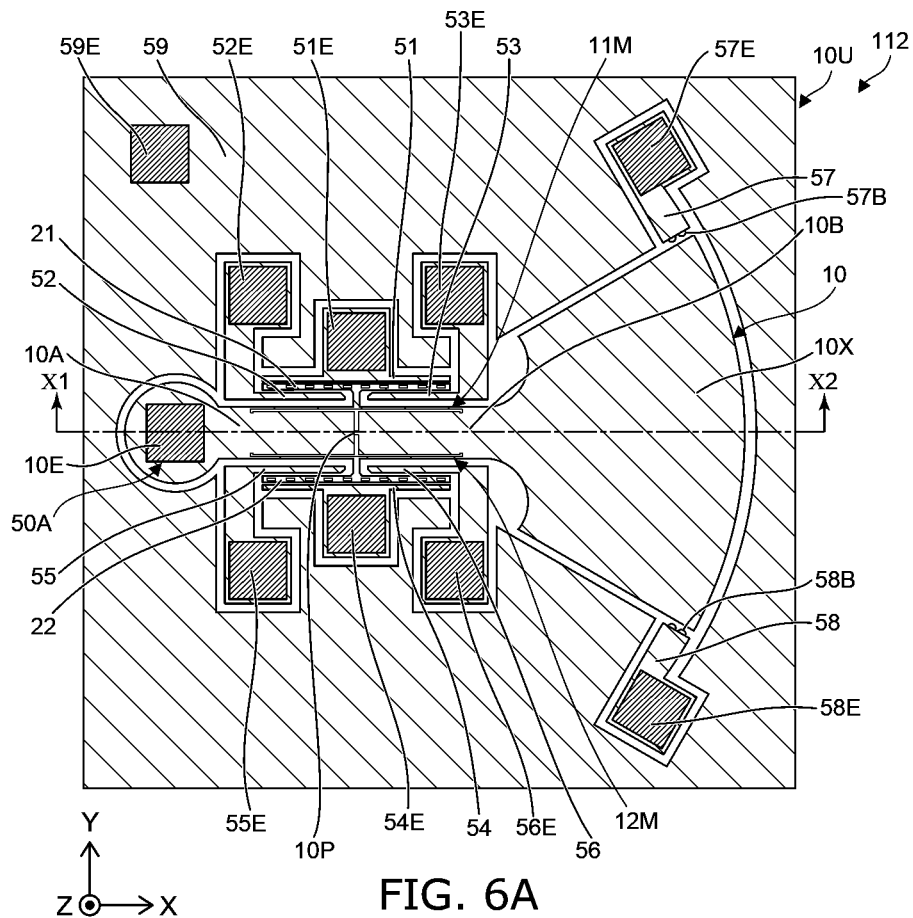
FIGS. 6A and 6B are schematic plan views illustrating a sensor according to the first embodiment.
Figure 7:
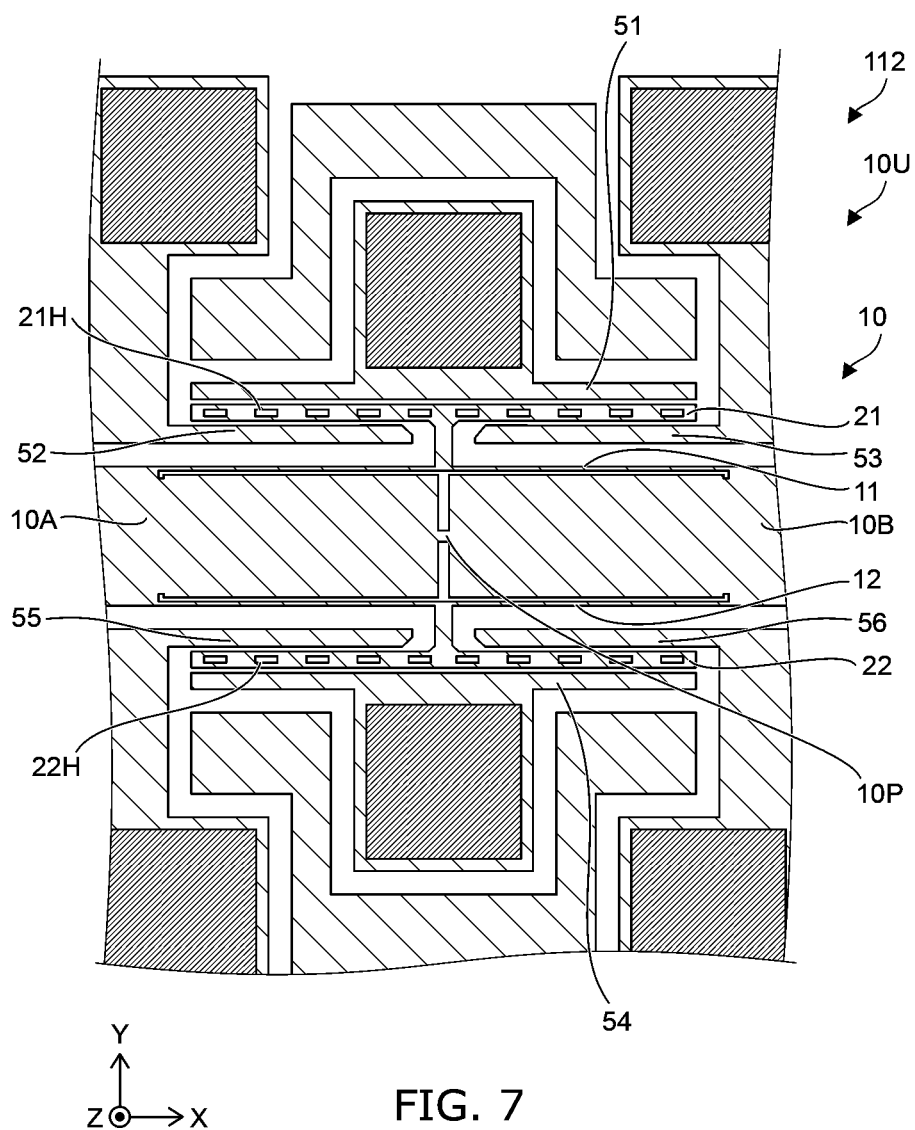
FIG. 7 is a schematic plan view illustrating the sensor according to the first embodiment.
Figure 8:
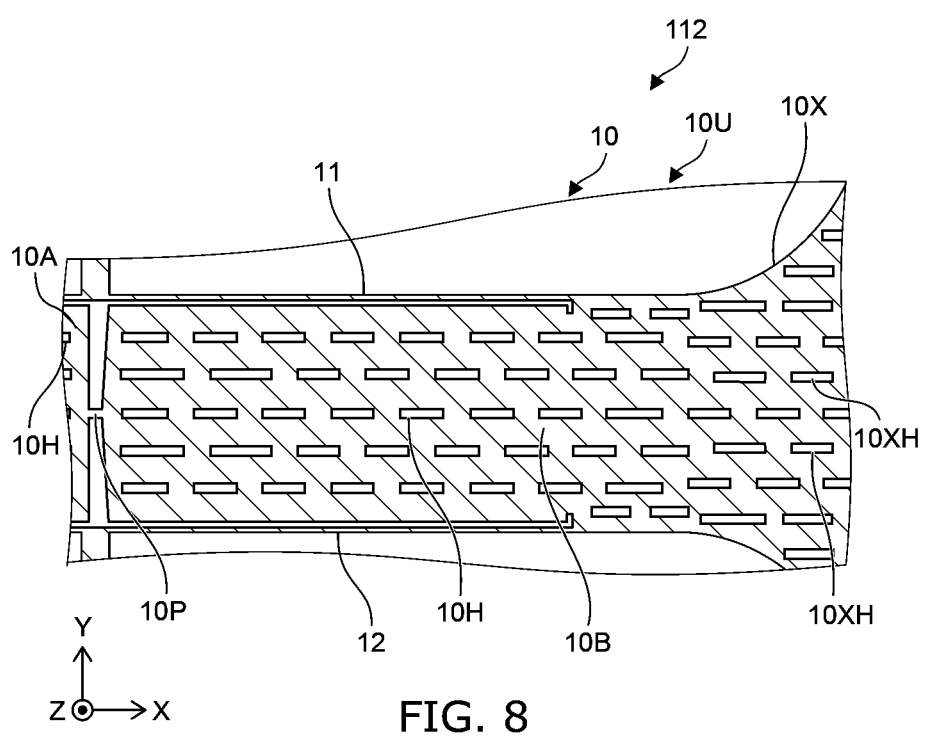
FIG. 8 is a schematic plan view illustrating the sensor according to the first embodiment.

FIG. 7 is an enlarged view of a portion of FIG. 6A. FIG. 8 is an enlarged view of a portion of FIG. 7.

Figure 6B:
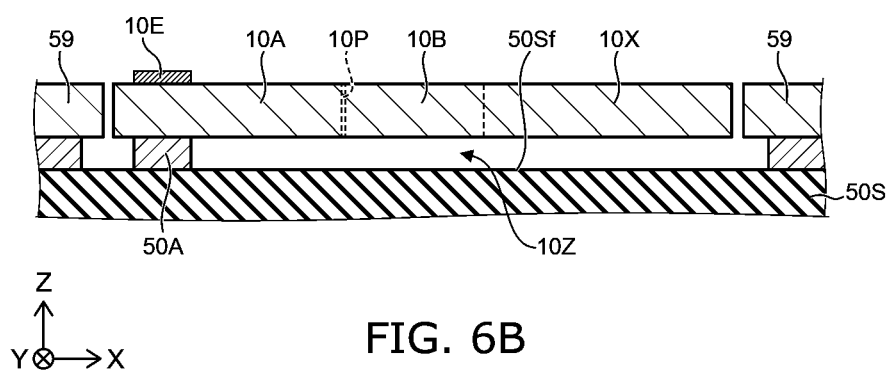

In the sensor 112 according to the embodiment as shown in FIGS. 6A and 6B, the first movable part 10 includes a movable member 10X in addition to the first movable base part 10A, the second movable base part 10B, the first movable beam 11M, and the second movable beam 12M. The movable member 10X is, for example, a movable mass.

The movable member 10X is connected to the second movable base part 10B. The movable member 10X is larger than the first movable conductive part 21. For example, the mass of the movable member 10X is larger than the mass of the first movable conductive part 21.

For example, an acceleration that has a component along the Y-axis direction is applied to the movable member 10X. Due to the acceleration, the movable member 10X has a rotational displacement with the connection part 10P as the center. Strain is generated in the first and second beams 11 and 12 according to the movement of the movable member 10X. For example, compressive strain is generated in the second beam 12 when tensile strain is generated in the first beam 11. For example, tensile strain is generated in the second beam 12 when compressive strain is generated in the first beam 11. The resonant frequencies change due to these strains.

By providing the movable member 10X, the strains are more effectively generated. The resonant frequencies can be more effectively changed. The acceleration can be detected with higher accuracy.

For example, the controller 70 (referring to FIG. 4) applies an alternating current voltage between the first movable conductive part 21 and the second counter conductive part 52 (and/or the third counter conductive part 53) and between the second movable conductive part 22 and the fifth counter conductive part 55 (and/or the sixth counter conductive part 56). For example, the controller 70 is configured to detect a value relating to the difference between the resonant frequency of the first movable beam 11M (the first beam 11) and the resonant frequency of the second movable beam 12M (the second beam 12) by detecting a signal between the first counter conductive part 51 and the first movable conductive part 21 and a signal between the fourth counter conductive part 54 and the second movable conductive part 22. The value corresponds to the movement of the movable member 10X.

In the example as shown in FIG. 6A, a seventh counter conductive part 57 and an eighth counter conductive part 58 that face the movable member 10X are provided. An electrode 57E that is electrically connected with the seventh counter conductive part 57 and an electrode 58E that is electrically connected with the eighth counter conductive part 58 may be provided. For example, the controller 70 may be configured to detect a value corresponding to the electrical capacitance between the seventh counter conductive part 57 and the movable member 10X and/or a value corresponding to the electrical capacitance between the eighth counter conductive part 58 and the movable member 10X. For example, the controller 70 may control the movable member 10X by adjusting the voltages applied to the seventh and eighth counter conductive parts 57 and 58. For example, the potentials of the seventh and eighth counter conductive parts 57 and 58 may be set to be equal to the potential of the movable member 10X. For example, the seventh counter conductive part 57 and the eighth counter conductive part 58 may function as stoppers that suppress shorts. A protrusion 57B may be provided at the side portion of the seventh counter conductive part 57. A protrusion 58B may be provided at the side portion of the eighth counter conductive part 58.

A ninth counter conductive part 59 may be provided as shown in FIGS. 6A and 6B. For example, the ninth counter conductive part 59 is located around the other counter conductive parts. An electrode 59E that is electrically connected to the ninth counter conductive part 59 may be provided. The controller 70 may set the electrode 59E (the ninth counter conductive part 59) to a ground potential. For example, the noise of the signals is suppressed.

An electrode 10E may be provided as shown in FIGS. 6A and 6B. The electrode 10E is electrically connected with the first movable part 10. The operations described above may be performed using the electrode 10E. The sensor 112 is, for example, a differential resonant accelerometer (DRA).

As shown in FIG. 7, the first movable conductive part 21 may include a hole 21H. The second movable conductive part 22 may include a hole 22H. For example, the resonant frequencies can be adjusted by providing the holes.

As shown in FIG. 8, at least one of the first movable base part 10A or the second movable base part 10B may include a hole 10H. For example, the resonant frequency due to the movable member 10X can be adjusted by providing the hole 10H. The movable member 10X may include a hole 10XH. For example, the resonant frequency due to the movable member 10X can be adjusted by providing the hole 10XH.

Figure 9A:
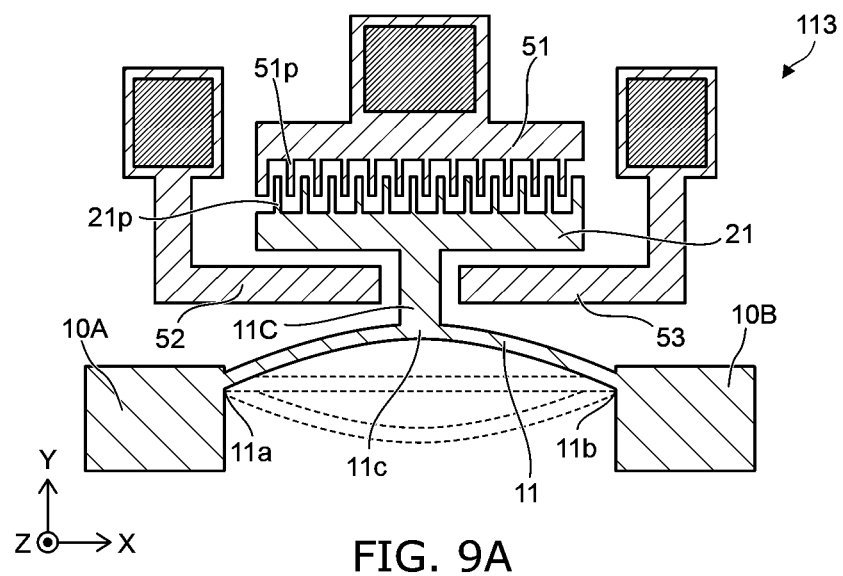
FIGS. 9A and 9B are schematic plan views illustrating a sensor according to the first embodiment.
Figure 9B:
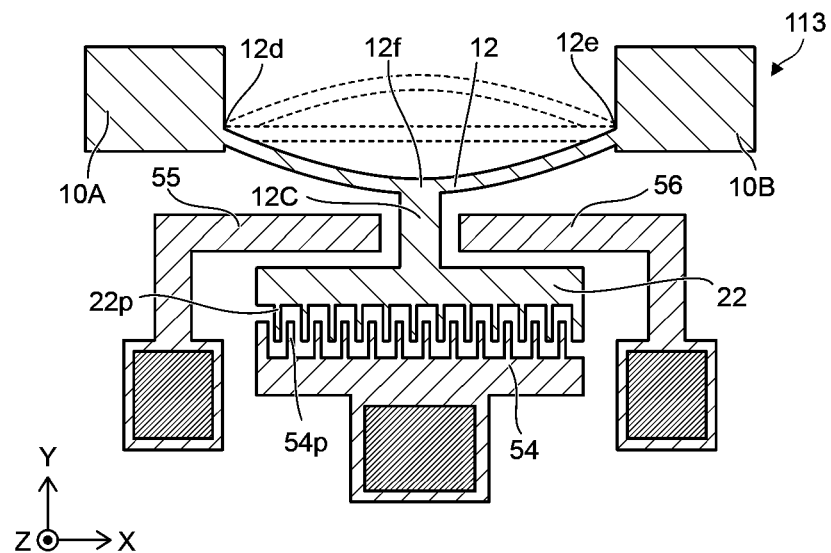

FIGS. 9A and 9B are schematic plan views illustrating a sensor according to the first embodiment.

In the sensor 113 according to the embodiment as shown in FIG. 9A, the first movable conductive part 21 and the first counter conductive part 51 have a comb electrode configuration. For example, multiple protruding parts 21p are provided in the first movable conductive part 21. For example, multiple protruding parts 51p are provided in the first counter conductive part 51. The multiple protruding parts 21p and the multiple protruding parts 51p are arranged in a comb teeth configuration. The mutually-facing surface area can be large due to the conductive parts having the comb electrode configurations. For example, the linearity of the electrical capacitance for the detection can be improved.

In the sensor 113 according to the embodiment as shown in FIG. 9B, the second movable conductive part 22 and the fourth counter conductive part 54 have a comb electrode configuration. For example, multiple protruding parts 22p are provided in the second movable conductive part 22. For example, multiple protruding parts 54p are provided in the fourth counter conductive part 54. The multiple protruding parts 22p and the multiple protruding parts 54p are arranged in a comb teeth configuration. The mutually-facing surface area can be large due to the conductive parts having comb electrode configurations. For example, the linearity of the electrical capacitance for the detection can be improved.

Figure 10A:
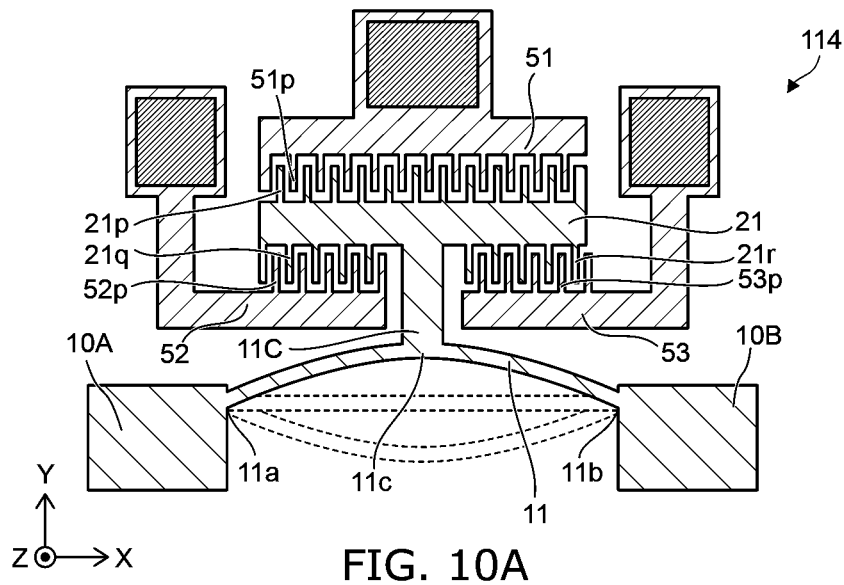
FIGS. 10A and 10B are schematic plan views illustrating a sensor according to the first embodiment.
Figure 10B:
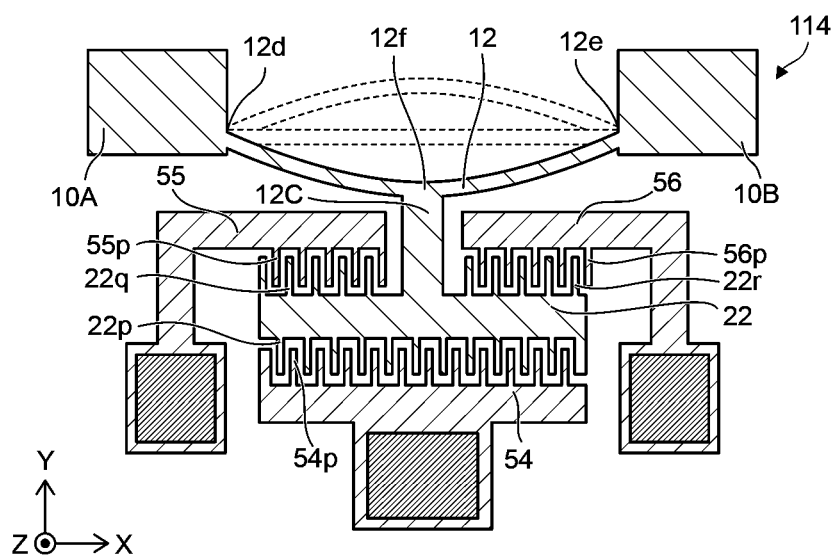

FIGS. 10A and 10B are schematic plan views illustrating a sensor according to the first embodiment.

In the sensor 114 according to the embodiment as shown in FIG. 10A, the first movable conductive part 21 and the second counter conductive part 52 have a comb electrode configuration. The first movable conductive part 21 and the third counter conductive part 53 have a comb electrode configuration. For example, multiple protruding parts 21q and multiple protruding parts 21r are provided in the first movable conductive part 21. For example, multiple protruding parts 52p are provided in the second counter conductive part 52. For example, multiple protruding parts 53p are provided in the third counter conductive part 53. The multiple protruding parts 21q and the multiple protruding parts 52p are arranged in a comb teeth configuration. The multiple protruding parts 21r and the multiple protruding parts 53p are arranged in a comb teeth configuration. The mutually-facing surface area can be large due to the conductive parts having comb electrode configurations. For example, the first movable conductive part 21 and the first counter conductive part 51 have a comb electrode configuration. For example, the multiple protruding parts 21p are provided in the first movable conductive part 21. For example, the multiple protruding parts 51p are provided in the first counter conductive part 51. The multiple protruding parts 21p and the multiple protruding parts 51p are arranged in a comb teeth configuration. The mutually-facing surface area can be large due to the conductive parts having comb electrode configurations. For example, the linearity of the electrical capacitance for the detection can be improved. For example, high controllability is easily obtained.

In the sensor 114 according to the embodiment as shown in FIG. 10B, the second movable conductive part 22 and the fifth counter conductive part 55 have a comb electrode configuration. The second movable conductive part 22 and the sixth counter conductive part 56 have a comb electrode configuration. For example, multiple protruding parts 22q and multiple protruding parts 22r are provided in the second movable conductive part 22. For example, multiple protruding parts 55p are provided in the fifth counter conductive part 55. For example, multiple protruding parts 56p are provided in the sixth counter conductive part 56. The multiple protruding parts 22q and the multiple protruding parts 55p are arranged in a comb teeth configuration. The multiple protruding parts 22r and the multiple protruding parts 56p are arranged in a comb teeth configuration. The mutually-facing surface area can be large due to the conductive parts having comb electrode configurations. For example, the second movable conductive part 22 and the fourth counter conductive part 54 have a comb electrode configuration. For example, the multiple protruding parts 22p are provided in the second movable conductive part 22. For example, the multiple protruding parts 54p are provided in the fourth counter conductive part 54. The multiple protruding parts 22p and the multiple protruding parts 54p are arranged in a comb teeth configuration. The mutually-facing surface area can be large due to the conductive parts having comb electrode configurations. For example, the linearity of the electrical capacitance for the detection can be improved. For example, high controllability is easily obtained.

Second Embodiment

Figure 11:
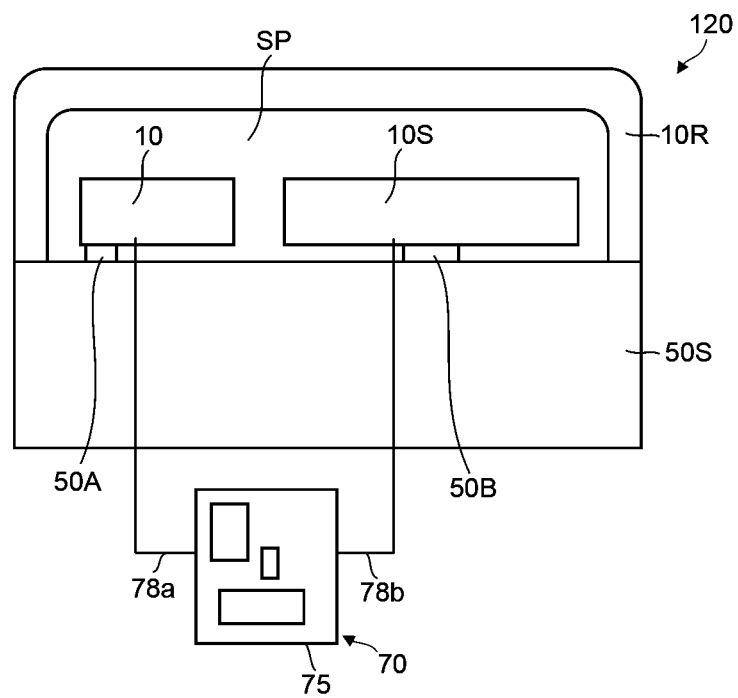
FIG. 11 is a schematic cross-sectional view illustrating a sensor according to a second embodiment.

FIG. 11 is a schematic cross-sectional view illustrating a sensor according to a second embodiment.

As shown in FIG. 11, the sensor 120 according to the embodiment includes a second supporter 50B and a second movable part 10S in addition to the configuration described in reference to the first embodiment (e.g., the base body 50S, the first supporter 50A, and the first movable part 10). The second supporter 50B is fixed to the base body 50S. The second movable part 10S is supported by the second supporter 50B and is separated from the base body 50S. The sensor 120 is configured to detect the angle of the sensor 120 based on a signal corresponding to the movement of the second movable part 10S. For example, at least a portion of the second movable part 10S is vibrated. The angle can be detected by detecting the vibration state that changes according to the change of the angle. For example, the angle is detected based on the principle of Foucault's pendulum. The second movable part 10S is, for example, a rate integrating gyroscope (RIG). The sensor 120 is, for example, an inertial measurement unit (IMU).

The configuration described in reference to the first embodiment is applicable to the configuration of the base body 50S, the first supporter 50A, the first movable part 10, etc., of the sensor 120.

As shown in FIG. 11, a lid part 10R may be provided in the sensor 120. The lid part 10R is connected to the base body 50S. The first supporter 50A, the first movable part 10, the second supporter 50B, and the second movable part 10S are between the base body 50S and the lid part 10R. For example, a space SP that is surrounded with the base body 50S and the lid part 10R is less than 1 atmosphere. By depressurizing the space SP, the detection can be performed with higher accuracy. The space SP is, for example, not more than 0.1 Pa.

As shown in FIG. 11, an electrical signal that is obtained from the first movable part 10 and an electrical signal that is obtained from the second movable part 10S may be supplied to a processing circuit 75. For example, the first movable part 10 and the processing circuit 75 are electrically connected by wiring 78a. The second movable part 10S and the processing circuit 75 are electrically connected by wiring 78b. The processing circuit 75 is, for example, a PLL (Phase Locked Loop) circuit. For example, the processing circuit 75 is included in the controller 70. The change of the resonant frequency obtained from the first movable part 10 can be detected by the processing circuit 75. For example, the acceleration can be detected thereby. The change of the resonant frequency obtained from the second movable part 10S can be detected by the processing circuit 75. For example, the angle can be detected thereby. The angular velocity may be detected. A small sensor is obtained.

Third Embodiment

A third embodiment relates to an electronic device.

Figure 12:
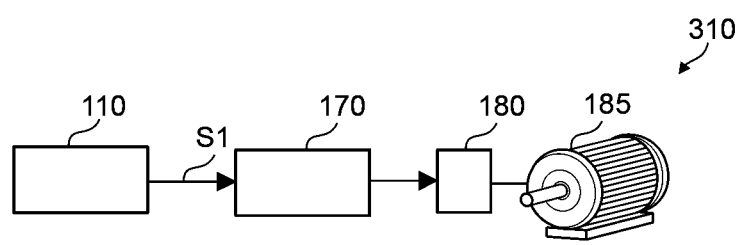
FIG. 12 is a schematic view illustrating an electronic device according to a third embodiment.

FIG. 12 is a schematic view illustrating the electronic device according to the third embodiment.

As shown in FIG. 12, the electronic device 310 according to the third embodiment includes a circuit controller 170 and the sensor according to the first or second embodiment. The sensor 110 is illustrated as the sensor in the example of FIG. 12. The circuit controller 170 is configured to control a circuit 180 based on a signal S1 obtained from the sensor. The circuit 180 is, for example, a control circuit of a drive device 185, etc. According to the embodiment, the circuit 180 for controlling the drive device 185 and the like can be controlled with high accuracy based on the high-accuracy detection result.

FIGS. 13A to 13H are schematic views illustrating applications of the electronic device.

Figure 13A:
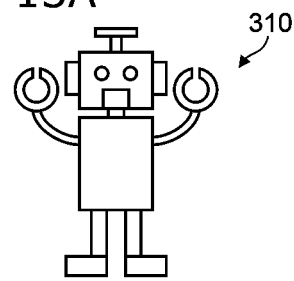
FIGS. 13A to 13H are schematic views illustrating applications of the electronic device.
Figure 13B:
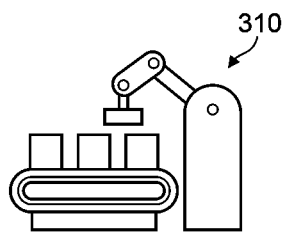
Figure 13C:
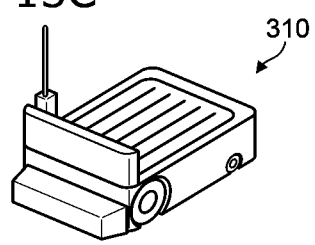
Figure 13D:
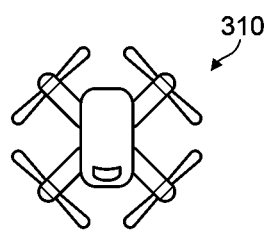
Figure 13E:
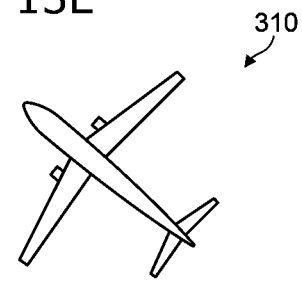
Figure 13F:
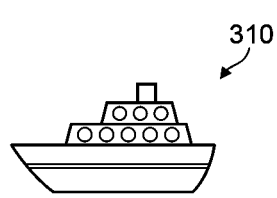
Figure 13G:
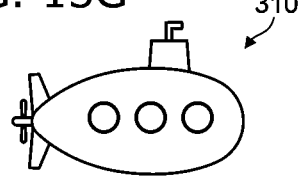
Figure 13H:
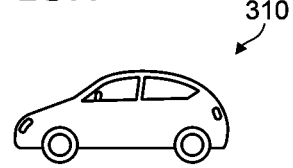

As shown in FIG. 13A, the electronic device 310 may be at least a portion of a robot. As shown in FIG. 13B, the electronic device 310 may be at least a portion of a machining robot provided in a manufacturing plant, etc. As shown in FIG. 13C, the electronic device 310 may be at least a portion of an automatic guided vehicle inside a plant, etc. As shown in FIG. 13D, the electronic device 310 may be at least a portion of a drone (an unmanned aircraft). As shown in FIG. 13E, the electronic device 310 may be at least a portion of an airplane. As shown in FIG. 13F, the electronic device 310 may be at least a portion of a ship. As shown in FIG. 13G, the electronic device 310 may be at least a portion of a submarine. As shown in FIG. 13H, the electronic device 310 may be at least a portion of an automobile. The electronic device 310 according to the third embodiment may include, for example, at least one of a robot or a moving body.

According to the embodiment, for example, connection regions and movable conductive parts are provided at the center positions of the two resonant beams (the first beam 11 and the second beam 12). The connection regions and the movable conductive parts are "T-shaped" rigid masses. The width (the length) of the movable conductive part is greater than the width (the length) of the connection region. For example, the drive voltage can be low. For example, the detection accuracy can be increased.

Embodiments include the following configurations (e.g., technological proposals).

Configuration 1

A sensor, comprising:
a base body;
a first supporter fixed to the base body; and
a first movable part separated from the base body,
the first movable part including
a first movable base part supported by the first supporter,
a second movable base part connected with the first movable base part, and
a first movable beam,
the first movable beam including
a first beam,
a first movable conductive part, and
a first connection region,
the first beam including a first beam portion, a second beam portion, and a third beam portion between the first beam portion and the second beam portion,
the first beam portion being connected with the first movable base part,
the second beam portion being connected with the second movable base part,
the first connection region connecting the third beam portion and the first movable conductive part,
a length of the first movable conductive part along a first direction being greater than a length of the first connection region along the first direction,
the first direction being from the first beam portion toward the second beam portion.

Configuration 2

The sensor according to Configuration 1, further comprising:
a first counter conductive part that is fixed to the base body and faces the first movable conductive part.

Configuration 3

The sensor according to Configuration 2, further comprising:
a second counter conductive part that is fixed to the base body and faces the first movable conductive part,
at least a portion of the first movable conductive part being between the second counter conductive part and the first counter conductive part in a direction crossing the first direction.

Configuration 4

The sensor according to Configuration 3, further comprising:
a third counter conductive part that is fixed to the base body and faces the first movable conductive part, a portion of the first movable conductive part being between the third counter conductive part and the first counter conductive part in the direction crossing the first direction,
at least a portion of the first connection region being between the second counter conductive part and the third counter conductive part in the first direction.

Configuration 5

The sensor according to Configuration 4, wherein
the first movable conductive part and the second counter conductive part have a comb electrode configuration, and
the first movable conductive part and the third counter conductive part have a comb electrode configuration.

Configuration 6

The sensor according to any one of Configurations 2 to 5, wherein
the first movable conductive part and the first counter conductive part have a comb electrode configuration.

Configuration 7

The sensor according to Configuration 3 or 4, further comprising:
a controller,
the controller applying an alternating current voltage between the second counter conductive part and the first movable conductive part,
the controller being configured to detect a change of a resonant frequency of the first movable beam by detecting a signal between the first counter conductive part and the first movable conductive part.

Configuration 8

The sensor according to any one of Configurations 1 to 6, wherein
the first movable part further includes a second movable beam and a connection part,
the connection part is located between the first movable base part and the second movable base part and connects the second movable base part with the first movable base part,
a position of the connection part in a second direction crossing the first direction is between a position of the second movable beam in the second direction and a position of the first movable beam in the second direction,
the second movable beam includes
a second beam,
a second movable conductive part, and
a second connection region,
the second beam includes a fourth beam portion, a fifth beam portion, and a sixth beam portion between the fourth beam portion and the fifth beam portion,
the fourth beam portion is connected with the first movable base part,
the fifth beam portion is connected with the second movable base part,
a direction from the fourth beam portion toward the fifth beam portion is along the first direction,
the second connection region connects the sixth beam portion and the second movable conductive part, and
a length of the second movable conductive part along the first direction is greater than a length of the second connection region along the first direction.

Configuration 9
  The sensor according to Configuration 8, wherein
  the connection part is between the second movable conductive part and the first movable conductive part in the second direction,
  the second beam is between the second movable conductive part and the connection part in the second direction, and
  the first beam is between the connection part and the first movable conductive part in the second direction.

Configuration 10
  The sensor according to Configuration 6 or 7, further comprising:
  a fourth counter conductive part that is fixed to the base body and faces the second movable conductive part.

Configuration 11
  The sensor according to Configuration 10, further comprising:
  a fifth counter conductive part that is fixed to the base body and faces the second movable conductive part,
  at least a portion of the second movable conductive part being between the fourth counter conductive part and the fifth counter conductive part in the second direction.

Configuration 12
  The sensor according to Configuration 11, further comprising:
  a sixth counter conductive part that is fixed to the base body and faces the second movable conductive part,
  a portion of the second movable conductive part being between the sixth counter conductive part and the fourth counter conductive part in the second direction,
  at least a portion of the second connection region being between the fifth counter conductive part and the sixth counter conductive part in the first direction.

Configuration 13
  The sensor according to Configuration 12, wherein
  the second movable conductive part and the fifth counter conductive part have a comb electrode configuration, and
  the second movable conductive part and the sixth counter conductive part have a comb electrode configuration.

Configuration 14
  The sensor according to one of Configurations 10 to 13, wherein
  the second movable conductive part and the fourth counter conductive part have a comb electrode configuration.

Configuration 15
  The sensor according to Configuration 11, further comprising:
  a controller,
  the controller applying an alternating current voltage between the second counter conductive part and the first movable conductive part and between the fifth counter conductive part and the second movable conductive part,
  the controller being configured to detect a value relating to a difference between a resonant frequency of the first movable beam and a resonant frequency of the second movable beam by detecting a signal between the first counter conductive part and the first movable conductive part and a signal between the fourth counter conductive part and the second movable conductive part.

Configuration 16
  The sensor according to any one of Configurations 1 to 15, wherein
  the first movable part further includes a movable member connected to the second movable base part, and
  the movable member is larger than the first movable conductive part.

Configuration 17
  The sensor according to Configuration 11, further comprising:
  a controller,
  the first movable part further including a movable member connected to the second movable base part,
  the movable member being larger than the first movable conductive part,
  the controller applying an alternating current voltage between the second counter conductive part and the first movable conductive part and between the fifth counter conductive part and the second movable conductive part,
  the controller being configured to detect a value relating to a difference between a resonant frequency of the first movable beam and a resonant frequency of the second movable beam by detecting a signal between the first counter conductive part and the first movable conductive part and a signal between the fourth counter conductive part and the second movable conductive part,
  the value corresponding to a movement of the movable member.

Configuration 18
  The sensor according to any one of Configurations 1 to 17, further comprising:
  a second supporter fixed to the base body; and
  a second movable part supported by the second supporter and separated from the base body,
  the sensor being configured to detect an angle based on a signal corresponding to a movement of the second movable part.

Configuration 19
  The sensor according to Configuration 18, further comprising:
  a lid part connected to the base body,
  the first supporter, the first movable part, the second supporter, and the second movable part being between the base body and the lid part,
  a space that is less than 1 atmosphere being surrounded with the base body and the lid part.

Configuration 20
  An electronic device, comprising:
  the sensor according to any one of Configurations 1 to 19; and
  a circuit controller configured to control a circuit based on a signal obtained from the sensor.

According to embodiments, a sensor and an electronic device can be provided in which the detection accuracy can be increased.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as base bodies, supporters, movable parts, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors, and electronic devices practicable by an appropriate design modification by one skilled in the art based on the sensors, and the electronic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
a base body;
a first supporter fixed to the base body; and
a first movable part separated from the base body,
the first movable part including
a first movable base part supported by the first supporter,
a second movable base part connected with the first movable base part, and
a first movable beam,
the first movable beam including
a first beam,
a first movable conductive part, and
a first connection region,
the first beam including a first beam portion, a second beam portion, and a third beam portion between the first beam portion and the second beam portion,
the first beam portion being connected with the first movable base part,
the second beam portion being connected with the second movable base part,
the first connection region connecting the third beam portion and the first movable conductive part,
a length of the first movable conductive part along a first direction being greater than a length of the first connection region along the first direction,
the first direction being from the first beam portion toward the second beam portion,
wherein
the first movable part further includes a second movable beam and a connection part,
the connection part is located between the first movable base part and the second movable base part and connects the second movable base part with the first movable base part,
a position of the connection part in a second direction crossing the first direction is between a position of the second movable beam in the second direction and a position of the first movable beam in the second direction,
the second movable beam includes
a second beam,
a second movable conductive part, and
a second connection region,
the second beam includes a fourth beam portion, a fifth beam portion, and a sixth beam portion between the fourth beam portion and the fifth beam portion,
the fourth beam portion is connected with the first movable base part,
the fifth beam portion is connected with the second movable base part,
a direction from the fourth beam portion toward the fifth beam portion is along the first direction,
the second connection region connects the sixth beam portion and the second movable conductive part, and
a length of the second movable conductive part along the first direction is greater than a length of the second connection region along the first direction.

2. The sensor according to claim 1, further comprising:
a first counter conductive part that is fixed to the base body and faces the first movable conductive part.

3. The sensor according to claim 2, further comprising:
a second counter conductive part that is fixed to the base body and faces the first movable conductive part,
at least a portion of the first movable conductive part being between the second counter conductive part and the first counter conductive part in a direction crossing the first direction.

4. The sensor according to claim 3, further comprising:
a third counter conductive part that is fixed to the base body and faces the first movable conductive part,
a portion of the first movable conductive part being between the third counter conductive part and the first counter conductive part in the direction crossing the first direction,
at least a portion of the first connection region being between the second counter conductive part and the third counter conductive part in the first direction.

5. The sensor according to claim 4, wherein
the first movable conductive part and the second counter conductive part have a comb electrode configuration, and
the first movable conductive part and the third counter conductive part have a comb electrode configuration.

6. The sensor according to claim 2, wherein
the first movable conductive part and the first counter conductive part have a comb electrode configuration.

7. The sensor according to claim 3, further comprising:
a controller,
the controller applying an alternating current voltage between the second counter conductive part and the first movable conductive part,
the controller being configured to detect a change of a resonant frequency of the first movable beam by detecting a signal between the first counter conductive part and the first movable conductive part.

8. The sensor according to claim 1, wherein
the connection part is between the second movable conductive part and the first movable conductive part in the second direction,
the second beam is between the second movable conductive part and the connection part in the second direction, and
the first beam is between the connection part and the first movable conductive part in the second direction.

9. The sensor according to claim 4, further comprising:
a fourth counter conductive part that is fixed to the base body and faces the second movable conductive part.

10. The sensor according to claim 9, further comprising:
a fifth counter conductive part that is fixed to the base body and faces the second movable conductive part, at least a portion of the second movable conductive part being between the fourth counter conductive part and the fifth counter conductive part in the second direction.

11. The sensor according to claim 10, further comprising:
a sixth counter conductive part that is fixed to the base body and faces the second movable conductive part,
a portion of the second movable conductive part being between the sixth counter conductive part and the fourth counter conductive part in the second direction,
at least a portion of the second connection region being between the fifth counter conductive part and the sixth counter conductive part in the first direction.

12. The sensor according to claim 11, wherein
the second movable conductive part and the fifth counter conductive part have a comb electrode configuration, and
the second movable conductive part and the sixth counter conductive part have a comb electrode configuration.

13. The sensor according to claim 9, wherein
the second movable conductive part and the fourth counter conductive part have a comb electrode configuration.

14. The sensor according to claim 10, further comprising:
a controller,
the controller applying an alternating current voltage between the second counter conductive part and the first movable conductive part and between the fifth counter conductive part and the second movable conductive part,
the controller being configured to detect a value relating to a difference between a resonant frequency of the first movable beam and a resonant frequency of the second movable beam by detecting a signal between the first counter conductive part and the first movable conductive part and a signal between the fourth counter conductive part and the second movable conductive part.

15. The sensor according to claim 1, wherein
the first movable part further includes a movable member connected to the second movable base part, and the movable member is larger than the first movable conductive part.

16. The sensor according to claim 10, further comprising:
a controller,
the first movable part further including a movable member connected to the second movable base part,
the movable member being larger than the first movable conductive part,
the controller applying an alternating current voltage between the second counter conductive part and the first movable conductive part and between the fifth counter conductive part and the second movable conductive part,
the controller being configured to detect a value relating to a difference between a resonant frequency of the first movable beam and a resonant frequency of the second movable beam by detecting a signal between the first counter conductive part and the first movable conductive part and a signal between the fourth counter conductive part and the second movable conductive part,
the value corresponding to a movement of the movable member.

17. The sensor according to claim 1, further comprising:
a second supporter fixed to the base body; and
a second movable part supported by the second supporter and separated from the base body,
the sensor being configured to detect an angle based on a signal corresponding to a movement of the second movable part.

18. The sensor according to claim 17, further comprising:
a lid part connected to the base body,
the first supporter, the first movable part, the second supporter, and the second movable part being between the base body and the lid part,
a space that is less than 1 atmosphere being surrounded with the base body and the lid part.

19. An electronic device, comprising:
the sensor according to claim 1; and
a circuit controller configured to control a circuit based on a signal obtained from the sensor.

* * * * *